(12) United States Patent
Ajjikuttira et al.

(10) Patent No.: US 7,356,106 B2
(45) Date of Patent: Apr. 8, 2008

(54) CLOCK AND DATA RECOVERY CIRCUIT

(75) Inventors: Aruna B. Ajjikuttira, Singapore (SG); Nuntha Kumar s/o Krishnasamy Maniam, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 676 days.

(21) Appl. No.: 10/935,431

(22) Filed: Sep. 7, 2004

(65) Prior Publication Data

US 2006/0050821 A1    Mar. 9, 2006

(51) Int. Cl.
*H04L 7/00* (2006.01)
(52) U.S. Cl. .................. 375/354; 375/355; 375/324; 375/377; 327/47; 327/72
(58) Field of Classification Search ........ 375/354–377, 375/316, 282, 283, 293, 324–333; 327/47, 327/72, 141
See application file for complete search history.

(56) References Cited

U.S. PATENT DOCUMENTS 4,608,702 A * 8/1986 Hirzel et al. ............... 375/360
4,661,965 A * 4/1987 Maru ......................... 375/361
5,694,088 A * 12/1997 Dickson ..................... 331/12

OTHER PUBLICATIONS

Pottbacker, Ansgaret et al, "A Si bipolar phase and frequency detector IC for clock extraction up to 8 Gb/s", Dec. 1992, "IEEE Journal of solid-state circuits", vol. SC-27, pp. 1747-1751.*

Alexander, J.D.H., "Clock Recovery From Random Binary Signals," Electronics Letters, vol. 11, Oct. 1975, pp. 541-542.
Hogge, Charles R., "A Self Correcting Clock Recovery Circuit," Journal Of Lightwave Technologies, vol. LT-3, Dec. 1985, pp. 1312-1314.
Pottbacker, Ansgar et al., "A Si Bipolar Phase And Frequency Detector IC For Clock Extraction Up To 8 Gb/s," IEEE Journal Of Solid-State Circuits, vol. SC-27, Dec. 1992, pp. 1747-1751.
Razavi, Behzad, "Monolithic Phase-Locked Loops and Clock Recovery Circuits-Theory And Design," IEEE Press, 1996, 5 pgs.

* cited by examiner

*Primary Examiner*—David C. Payne
*Assistant Examiner*—Rahel Guarino
(74) *Attorney, Agent, or Firm*—Conley Rose, P.C.

(57) ABSTRACT

A clock and data recovery (CDR) circuit comprises a phase detector (PD) and a quadrature phase (QP) detector. A frequency detector (FD) is coupled to the PD and QP detector. The FD detects frequency difference between the output signals of the PD and QP detector and provides an FD output signal. A summer is coupled to the PD and FD for summing the PD and FD output signals, and for providing a summer output signal. The CDR further comprises a voltage-controlled oscillator (VCO) for receiving a direct current signal and providing a recovered clock signal. A polyphase filter is coupled to each of the VCO, PD, and QP detector. A re-timer is coupled to the polyphase filter and provides a re-timed data signal, wherein the CDR circuit is on-chip and the polyphase filter converts clock signals into phase reference signals.

20 Claims, 11 Drawing Sheets

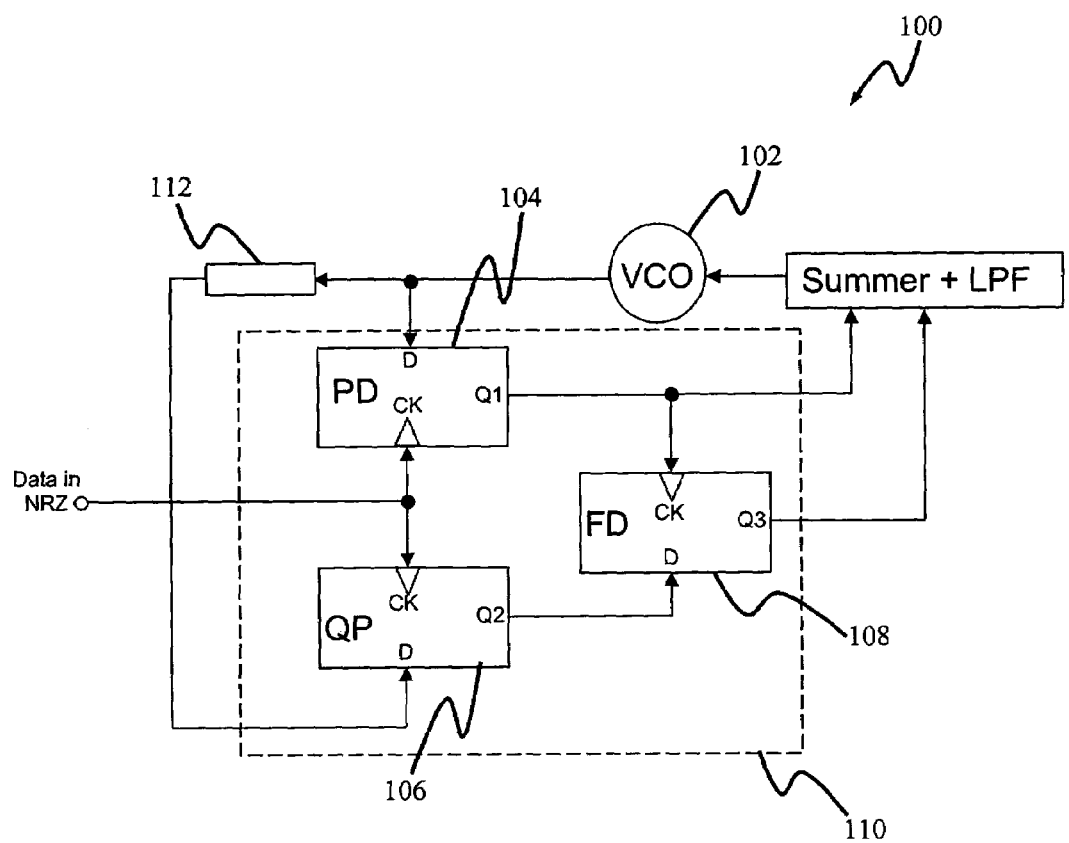
Fig. 1 – Prior Art

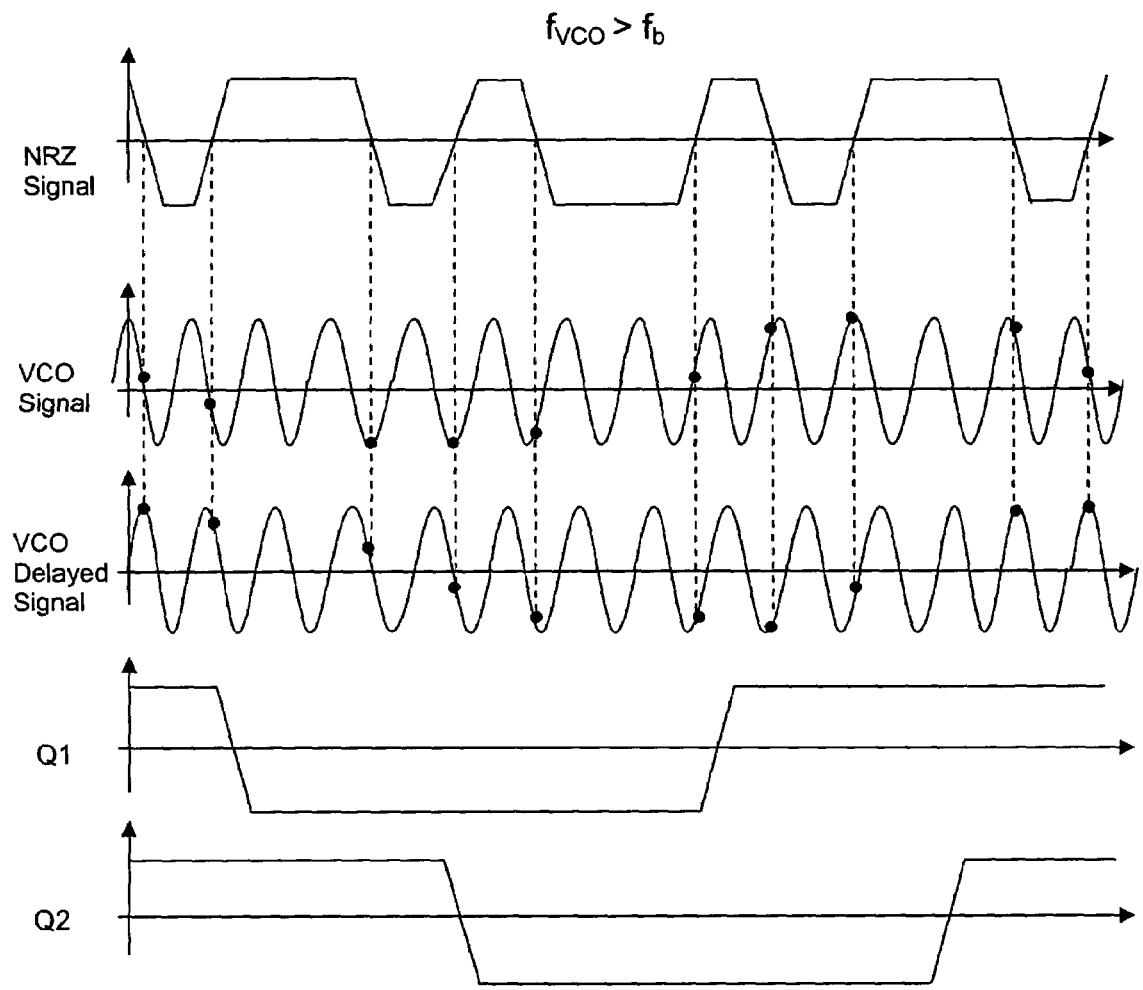
Fig. 2a – Prior Art

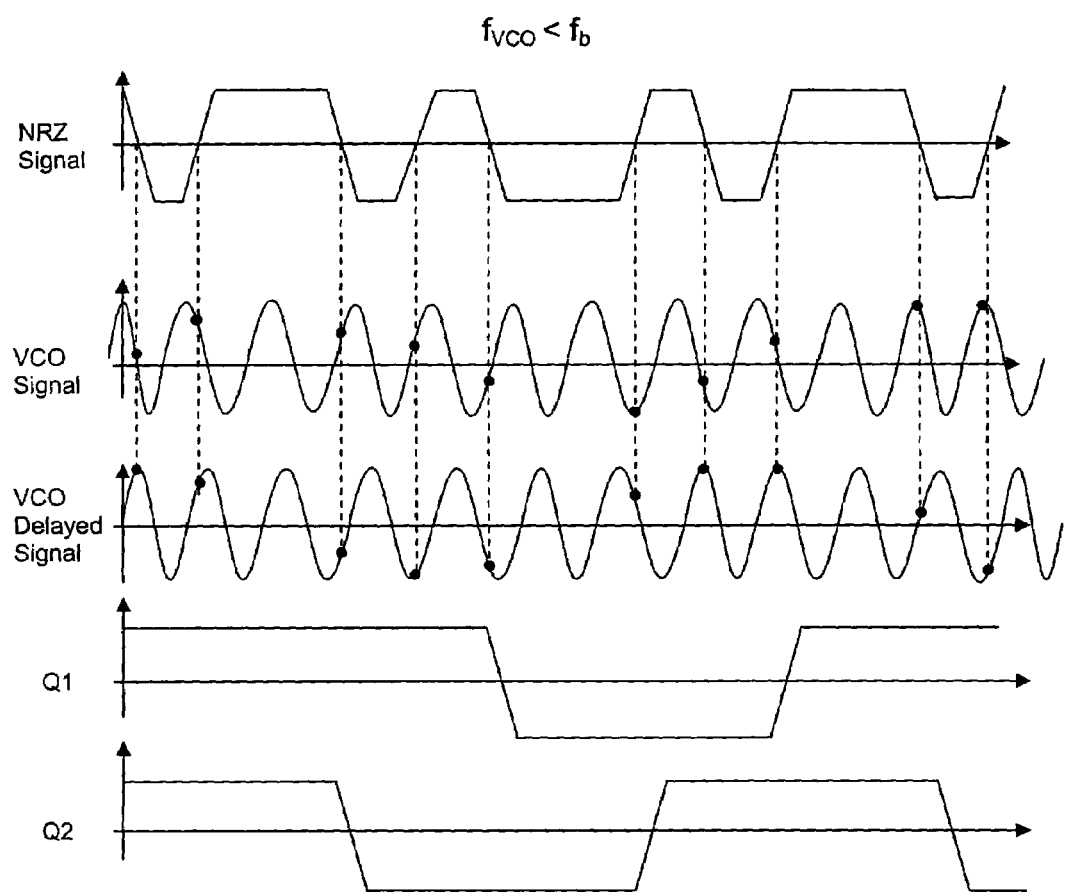
Fig. 2b – Prior Art

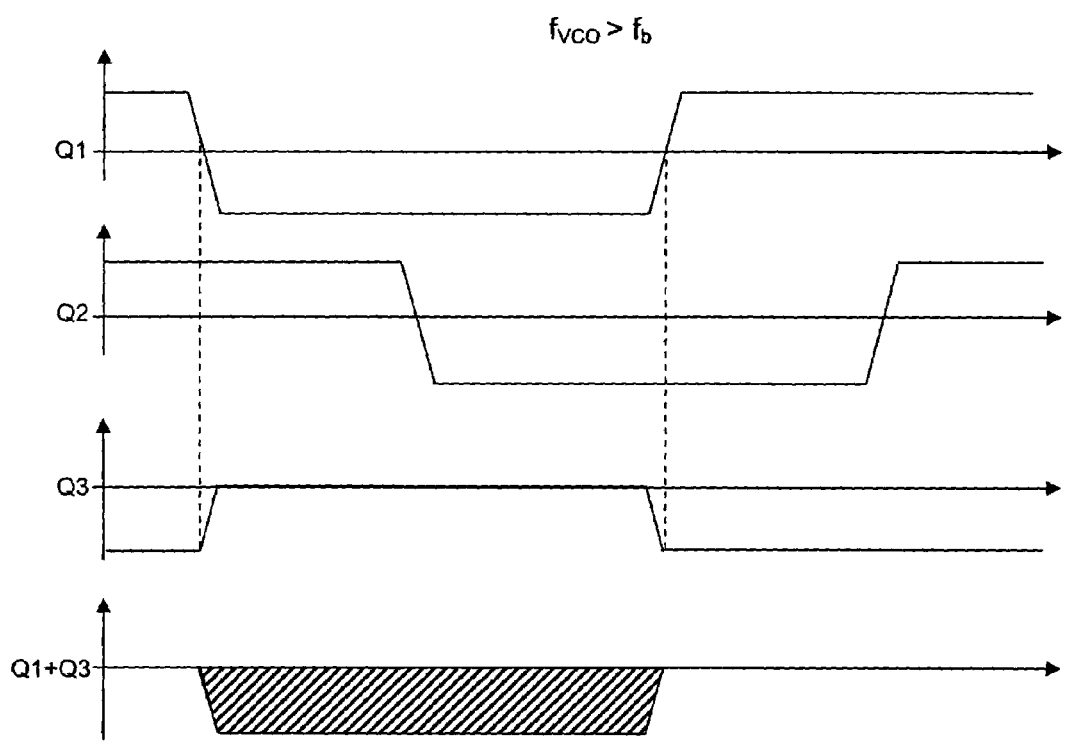
Fig. 3a – Prior Art

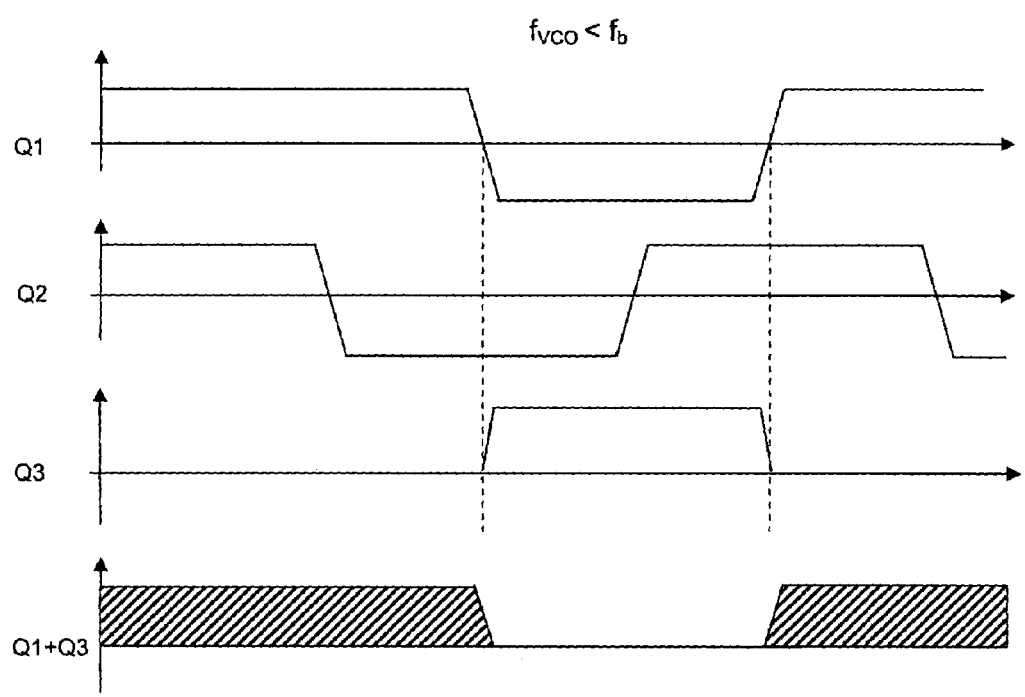
Fig. 3b – Prior Art ered to the VCO 102 via a loop filter, the VCO 102 will be in a locked state.

CLOCK AND DATA RECOVERY CIRCUIT

FIELD OF THE INVENTION

This invention relates generally to integrated circuits. In particular, the invention relates to a monolithic clock and data recovery circuit for high frequency operations.

BACKGROUND

In telecommunication applications where clock and data signals are respectively transmitted or received through separate cables, a phase difference between the clock and data signals often becomes more prominent during propagation over long distances. This is undesirable for many telecommunication applications that use synchronized digital systems, which require the clock and data signals to be in-phase for proper operations.

A single cable carrying only one data signal is therefore used in placed of the dual separated cables carrying the clock and data signal to avoid development of the phase difference between the clock and data signals. A data signal is transmitted and received in a non-return to zero (NRZ) format in which a clock signal is recovered from the data signal. The data signal transmitted and received in this manner is commonly known as an NRZ data signal.

A clock and data recovery (CDR) circuit is commonly used for recovering the clock signal from the NRZ data signal and is an important component in many telecommunication systems, such as high-speed optoelectronic data transceivers. The CDR circuit typically consists of a clock recovery block for recovering the clock signal from the NRZ data signal and a re-timing block for re-timing the NRZ data signal.

Most CDR circuits work in conjunction with phase-locked loops to provide the in-phase clock and data signals required by the synchronized digital systems. These CDR circuits have phase detectors, such as Alexander and Hogge phase detectors, that are used for comparing phases of frequency signals and providing control signals to other parts of the CDR circuit. However, such phase detectors significantly limit the working frequency range of input signals to the CDR circuits. This limitation to the working frequency range of input signals is substantially avoided through the use of a frequency detector in addition to the phase detector. The frequency detector and the phase detector collectively increase the working frequency range of input signals to the CDR circuits.

A CDR circuit 100 based on a quadricorrelator approach is disclosed in "A Si Bipolar Phase and Frequency Detector IC for Clock Extraction up to 8 Gb/s", by Pottbäcker et al., *IEEE Journal of Solid-State Circuits*, vol.SC-27, pp.1747-1751, December 1992 and shown in FIG. 1. The quadricorrelator based CDR circuit 100 requires quadrature signals generated from an off-chip voltage-controlled oscillator (VCO) 102 to be fed to a phase detector (PD) 104 and quadrature phase (QP) detector 106 for proper operation.

The VCO 102 provides a VCO signal with a clock frequency and a VCO delayed signal, wherein both signals are sampled by the NRZ data signal at every transition. This creates transition pulses at outputs Q1 and Q2 of the PD 104 and QP detector 106 respectively whenever the current operating frequency of the VCO 102 and the data bit rate of the NRZ data signal is different. FIGS. 2a and 2b illustrate respectively output waveforms generated by Q1 of the PD 102 and Q2 of the QP detector 106 when the clock frequency ($f_{VCO}$) is greater than frequency of the data bit rate ($f_b$) and when $f_{VCO}$ is less than $f_b$ respectively.

The PD 104 generates an output signal which is fed to a frequency detector (FD) 108 for sampling an output signal received by the FD 108 from the QP detector 106. The PD 104, QP detector 106 and FD 108 form an on-chip component 110 of the quadricorrelator based CDR circuit 100. A frequency difference signal is generated at an output Q3 of the FD 108.

FIGS. 3a and 3b show timing diagrams of output waveforms from Q1, Q2 and Q3 of the PD 104, QP detector 106 and FD 108 respectively when $f_{VCO}$ is greater than $f_b$ and when $f_{VCO}$ is less than $f_b$ respectively. A summed output of Q1 and Q3 when $f_{VCO}$ is greater than $f_b$ and when $f_{VCO}$ is less than $f_b$ are respectively depicted in FIGS. 3a and 3b. If the output waveform from Q2 is in a negative state during a rising edge of the output waveform from Q1, the output waveform of Q3 will be in a negative state. If the output waveform from Q2 is in the negative state during a falling edge of the output waveform from Q1, the output waveform from Q3 will be in a positive state. If the output waveform from Q2 is in the positive state, the output waveform from Q3 will be in a zero state during the falling and rising edge of the output waveform from Q1. Therefore, when the sum of the output waveforms from Q1 and Q3 is fed to the VCO 102 via a loop filter, the VCO 102 will be in a locked state.

In the quadricorrelator based CDR circuit 100, an off-chip delay line 112 is coupled to the off-chip VCO 102 for the purpose of generating quadrature signals. However, the externally generated quadrature signals render the quadricorrelator based CDR circuit 100 unsuitable for monolithic implementation.

One method of generating on-chip quadrature signals for monolithic implementation is to use an on-chip VCO that is capable of oscillating at twice the frequency of the desired clock frequency. An on-chip frequency divider, such as a master-slave D-flip flop is then coupled to the on-chip VCO to facilitate on-chip quadrature signal generation. However, this method requires high power consumption. Furthermore, any asymmetry in the duty cycle at the input of the master-slave D-flip flop, or any mismatch in the input circuitry of the master-slave D-flip flop can degrade the accuracy of generating the quadrature signals. Solving these problems will further increase the circuit complexity and power consumption.

Another method of generating the on-chip quadrature signals is to couple two identical on-chip VCOs together in such a way as to force the respective outputs of the VCOs to be 90° out of phase. However, this method requires considerably larger chip area to contain the two on-chip VCOs and also higher power consumption.

Still another method of generating the on-chip quadrature signals is to use a ring oscillator. However, the ring oscillators generally have poor noise performance and are therefore unsuitable for high-performance applications.

There is, therefore, a need for a CDR circuit based on a quadricorrelator approach in which on-chip quadrature signals are generated with low power consumption and small die area requirement.

SUMMARY

Embodiments of the invention disclosed herein possess improved performance relating to higher tolerance to fabrication process and ambient temperature variations while achieving performance on less on-chip area. Additionally, the embodiments of the invention have lower power consumption.

In accordance to a first aspect of the invention, a clock and data recovery circuit according to an embodiment of the invention for recovering a clock signal from a non-return to zero data signal and re-timing the data signal is disclosed. The clock and data recovery circuit comprises a phase detector for receiving the non-return to zero data signal and detecting phase difference between the non-return to zero data signal and a first reference phase signal for providing a phase detector output signal; a quadrature phase detector for receiving the non-return to zero data signal and detecting phase difference between the non-return to zero data signal and a second reference phase signal for providing a quadrature phase detector output signal; a frequency detector coupled to the phase detector and the quadrature phase detector for detecting frequency difference between the phase detector output signal and the quadrature phase detector output signal for providing a frequency detector output signal; a summer coupled to the phase detector and the frequency detector for summing the phase detector output signal and the frequency detector output signal for providing a summer output; a voltage-controlled oscillator for receiving a direct current signal and providing a recovered clock signal; a polyphase filter coupled respectively to the voltage-controlled oscillator for receiving the clock signal therefrom, the phase detector for providing the first phase reference signal thereto, the quadrature phase detector for providing the second reference phase signal thereto; and a re-timer for receiving the non-return to zero data signal and coupling to the polyphase filter for receiving the first reference phase signal for providing a re-timed data signal, wherein the clock and data recovery circuit is on-chip and the polyphase filter converts the clock signal into the first reference phase signal and the second reference phase signal.

In accordance to a second aspect of the invention, a method for recovering a clock signal from a non-return to zero data signal and re-timing the data signal is disclosed. The method comprising the steps of: detecting a phase difference between the non-return to zero data signal and a first reference phase signal by a phase detector for generating a phase detector output signal; detecting phase difference between the non-return to zero data signal and a second phase reference signal by a quadrature phase detector for generating a quadrature phase detector output signal; detecting frequency difference between the frequency detector output signal and the quadrature phase detector output signal by a frequency detector for providing a frequency detector output signal; summing the phase detector output signal and the frequency detector output signal by a summer for providing a summing output signal; filtering the summer output signal by an external filter for generating a direct current signal; converting the direct current signal by a voltage-controlled oscillator for providing a recovered clock signal; converting the recovered signal into the first reference phase signal and the second reference phase signal by a polyphase filter; applying the first reference phase signal to the phase detector and a re-timer and applying the second reference phase signal to the quadrature phase detector; applying the non-return to zero data signal to the re-timer and re-timing the non-return to zero data signal for providing a re-timed data signal.

BRIEF DESCRIPTION OF THE DRAWINGS

Embodiments of the invention are described hereinafter with reference to the drawings, in which:

FIG. 1 is a block diagram of a prior art quadricorrelator based CDR circuit;

FIGS. 2a and 2b are output waveforms related to the prior art quadricorrelator based CDR circuit of FIG. 1;

FIGS. 3a and 3b are timing diagrams related to the output waveforms of FIGS. 2a and 2b respectively;

DETAILED DESCRIPTION

With reference to the drawings, a clock and data recovery circuit according to an embodiment of the invention for recovering a clock signal from a non-return to zero (NRZ) data signal and re-timing the data signal is disclosed. Various techniques of providing on-chip quadrature signals have been previously proposed. However, these techniques either require substantial on-chip area or have high power consumption and are susceptible to fabrication process or ambient temperature variations. These techniques therefore are unsuitable for telecommunication applications that require less on-chip area, high tolerance to fabrication process or ambient temperature variations and operate on low power supplies.

For purposes of brevity and clarity, the description of the invention is limited hereinafter to biopolar transistors. This however does not preclude the application of embodiments of the invention to other circuit variations such as using field effect transistors or the like transistors to achieve similar operating performance. The functional principles fundamental to the embodiments of the invention remain the same throughout the variations.

The clock and data recovery circuit provides improved performance relating to higher tolerance to fabrication process and ambient temperature variations while achieving performance on less on-chip area. An additional advantage of the embodiments of the invention is lower power consumption.

A preferred embodiment of the invention is described in greater detail in accordance with FIGS. 4 to 11 of the drawings hereinafter, wherein like elements are assigned and labeled with like numerals and described accordingly.

Figure 4:
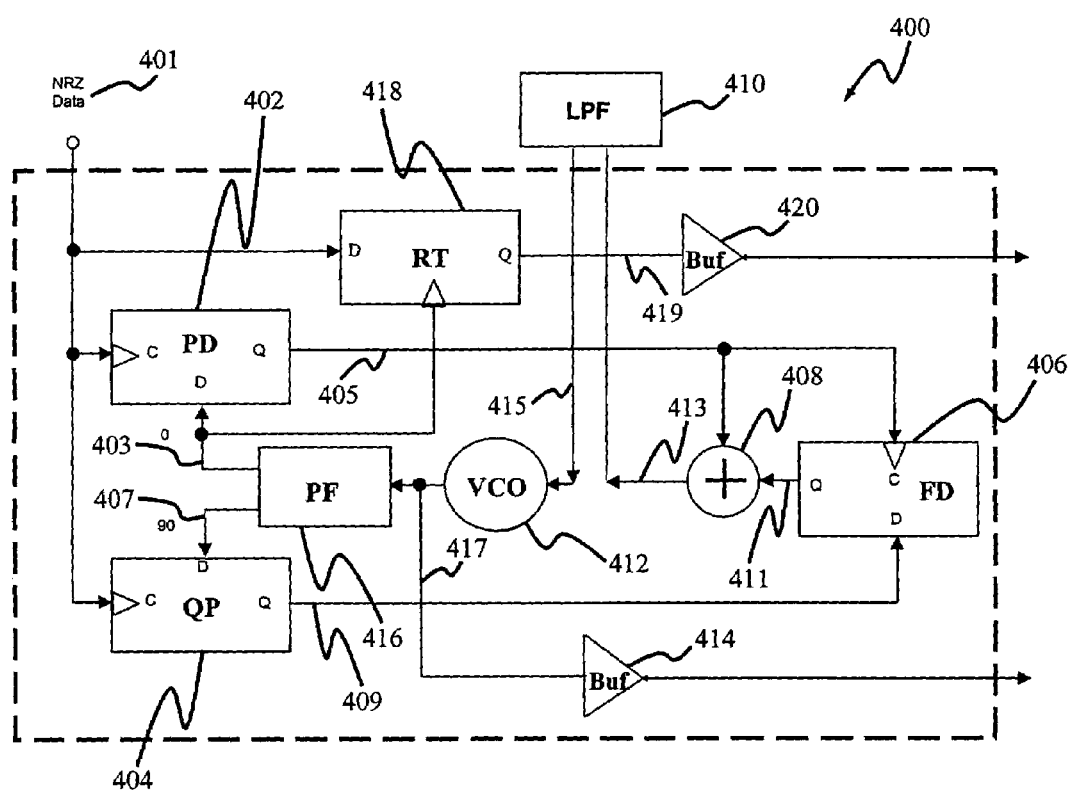
FIG. 4 is block diagram of a clock and data recovery circuit according to an embodiment of the invention.

A clock and data recovery circuit 400 according to an exemplary embodiment of the invention which performs a similar function as the quadricorrelator based CDR circuit 100 of FIG. 1 is shown in FIG. 4. The clock and data recovery circuit 400 comprises a phase detector 402 for receiving the NRZ data signal 401 and detecting phase difference between the NRZ data signal 401 and a first reference phase signal 403 and for providing a phase detector output signal 405. The clock and data recovery circuit 400 has a quadrature phase detector 404 for receiving the NRZ data signal and detecting phase difference between the NRZ data signal 401 and a second reference phase signal 407 and for providing a quadrature phase detector output signal 409. A frequency detector 406 is coupled to the phase detector 402 and the quadrature phase detector 404 for detecting frequency difference between the phase detector output signal 405 and the quadrature phase detector output signal 409 and for providing a frequency detector output signal 411.

A summer 408 is coupled to the phase detector 402 and the frequency detector 406 for summing the phase detector output signal 405 and the frequency detector output signal 411 and for providing a summer output signal 413. The summer output signal 413 is fed to an external low pass filter (LPF) 410 through an external connection from the summer 408 for removing the high frequency components of the summer output signal 413 and for providing a direct current signal 415. The direct current signal 415 is fed to a voltage-controlled oscillator (VCO) 412 through another external connection from the external low pass filter 410. The VCO 412 receives the direct current signal 415 and provides a recovered clock signal 417 to an external circuitry via a buffer 414.

A polyphase filter (PF) 416 is coupled respectively to the VCO 412 for receiving the recovered clock signal 417, the phase detector 402 for providing the first phase reference signal 403, and the quadrature phase detector 404 for providing the second reference phase signal 407. A re-timer (RT) 418 for receiving the NRZ data signal 401 is coupled to the polyphase filter 416 for receiving the first reference phase signal 403 and for providing a re-timed data signal 419 to the external circuitry via a buffer 420. The clock and data recovery circuit 400 is fabricated monolithically and the polyphase filter 416 converts the recovered clock signal 417 into the first reference phase signal 403 and the second reference phase signal 407.

All abovementioned components of the clock and data recovery circuit 400 operate in differential mode except the summer 408, which is single-ended.

Figure 5:
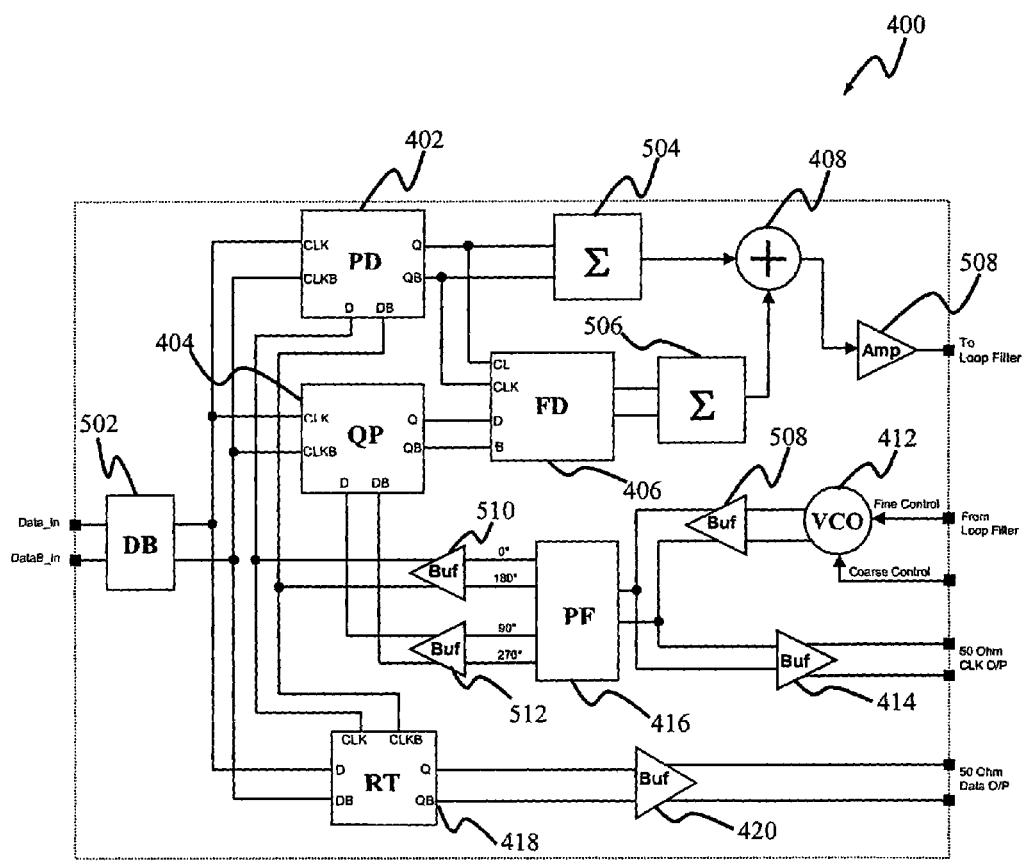
FIG. 5 is a detailed block diagram of the clock and data recovery circuit of FIG. 4 according to an embodiment of the invention.

A detailed block diagram of the clock and data recovery circuit 400 of FIG. 4 is shown in FIG. 5. A data buffer (DB) 502 having an input port for receiving the NRZ data signal and an output port being connected respectively to input ports of the phase detector 402, the quadrature phase detector 404 and the re-timer 418 for providing the NRZ data signal to the three abovementioned components of the clock and data recovery circuit 400. Each of the phase detector 402 and the frequency detector 406 has an output port that is respectively connected to an input port of differential-to-single-ended converters 504 and 506. The differential-to-single-ended converters 504 and 506 each having an output port that is connected to an input port of the summer 408. The differential-to-single-ended converters 504 and 506 convert the respective differential output signals of the phase detector 402 and the frequency detector 406 into single-ended output signals required by the single-ended summer 408.

The summer 408 has an output terminal that is connected an input terminal of an amplifier 508, which is single-ended. The amplifier 508 is connected to the external low pass filter 410 (not shown) through an output terminal. In a second embodiment of the invention, a differential summer and amplifier are used in place of the two differential-to-single-ended converters 504 and 506, the summer 408 and the amplifier 508.

The VCO 412 is preferably an inductor-capacitor (LC) oscillator as the LC oscillator provides a better noise and jitter performance and allows greater clock and data signal synchronization. The VCO 412 has an output port that is connected to an input port of a buffer 508. The buffer 508 has an output port connected to an input port of the polyphase filter 416 having a two-stage configuration. The buffer 508 is further connected to the buffer 414 for providing the recovered clock signal. The polyphase filter 416 provides the first reference phase signal to the phase detector 402 and the re-timer 418 via a buffer 510 and the second reference phase signal via a buffer 512.

Figure 6:
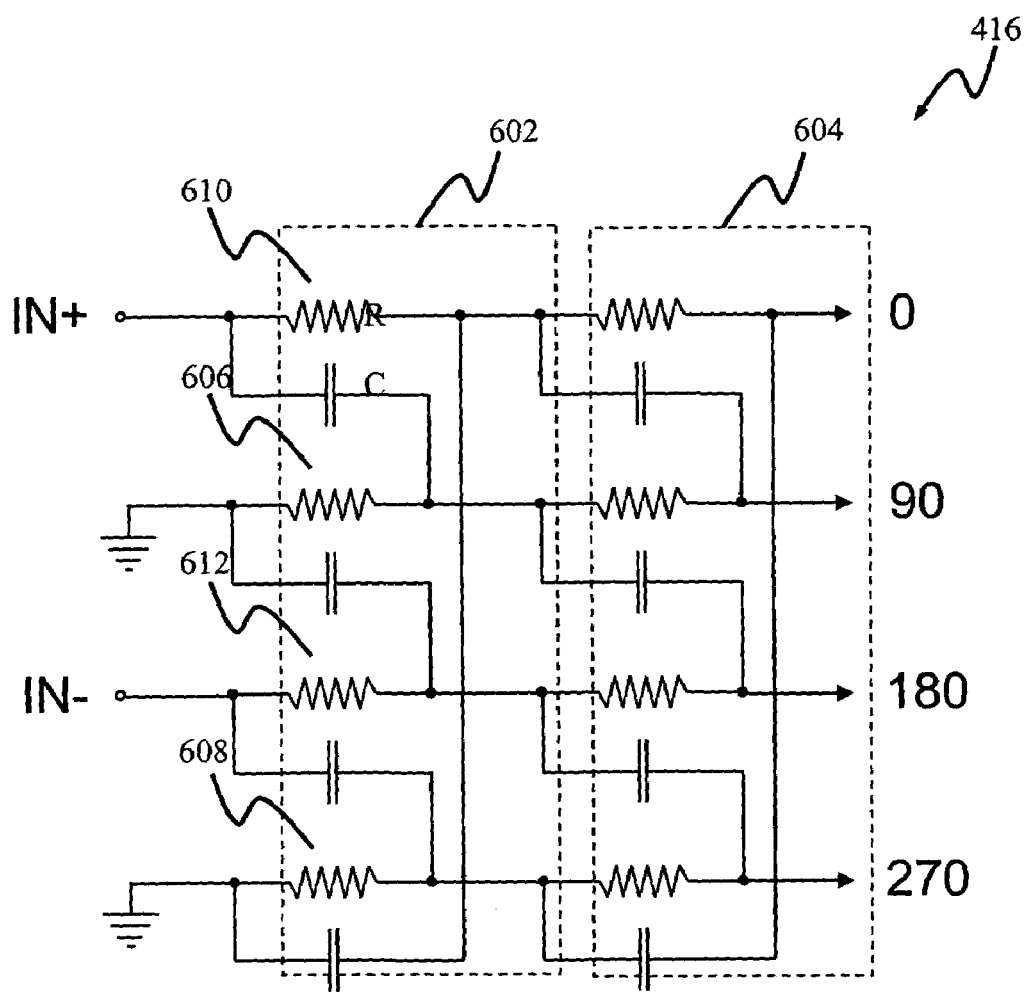
FIG. 6 is a circuit diagram of a two-stage polyphase filter.

The polyphase filter 416 preferably comprises two-stage or two cascaded four-phase network sections 602 and 604, as shown in FIG. 6. The polyphase filter 416 may be single-stage or multiple-stage. Each stage or four-phase network section has four input and output terminal pairs for providing four output signals of different phases. A resistor R is connected in between each input and output terminal of the four input and output terminal pairs. The input terminal of each phase is connected to the output of an adjacent leading phase via a capacitor C. For the poly-phase filter 416 operating in a 10 Gbps system, the first stage is preferably operable at approximately 9 GHz and the second stage is preferably operable at approximately 11 GHz. The values of resistor R and capacitor C in each stage of the poly-phase filter 416 are related according to the following relationship:

$$f=1/(2\pi RC)$$

where f is the operating frequency and R and C are the values of resistor R and capacitor C respectively. Therefore, the value of capacitor C is known once the value of resistor R is determined, or vice versa.

A second and fourth input terminal 606 and 608 are connected respectively to ground. The differential signals from the VCO 412 are correspondingly fed to a first and third input terminal 610 and 612 for conversion into the quadrature signals. The first and third input and output terminal pair of the polyphase filter 416 generate two signals having phase difference of 180° for providing the first reference phase signal to the phase detector 402 and the re-timer 418 via the buffer 510. The second and fourth input and output terminal pair of the polyphase filter 416 generate two other signals having phase difference of 180° for providing the second reference phase signal to the quadrature phase detector 404 via the buffer 512. The polyphase filter 416 is configured to provide sufficient tolerance margin for the clock and data recovery circuit 400 to contain fabrication process or ambient temperature variations and reduces on-chip area for generating on-chip quadrature signals.

Figure 7:
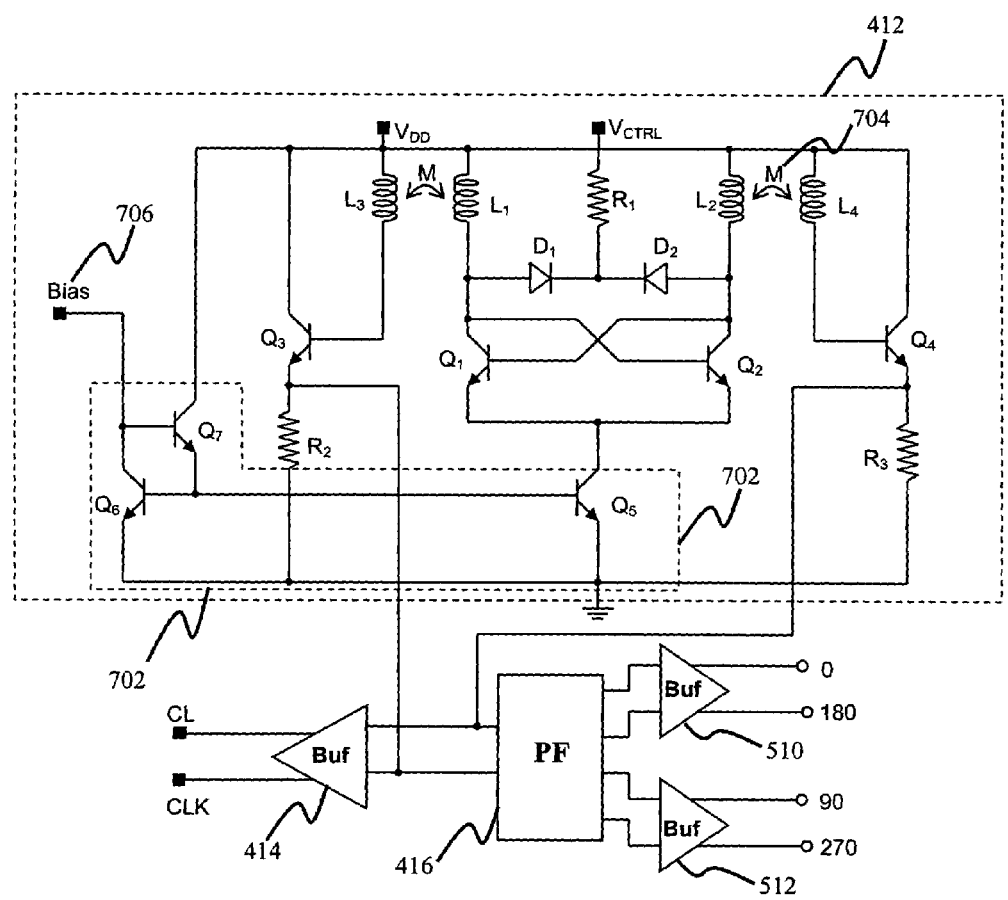
FIG. 7 is a circuit diagram of a voltage-controlled oscillator coupled to the two-stage polyphase filter of FIG. 6.

FIG. 7 shows a schematic diagram of the VCO 412 and the polyphase filter 416 for generating the quadrature signals. A differential pair of cross-coupled transistors $Q_1$ and $Q_2$ forms the core of the VCO 412. The emitters of the cross-coupled transistors $Q_1$ and $Q_2$ are connected to the collector of transistor $Q_5$. The emitter of transistor $Q_5$ is connected to ground while the base of transistor $Q_5$ is connected respectively to the base of transistor $Q_6$ and the emitter of transistor $Q_7$. The emitter of transistor $Q_6$ is connected to ground while the collector of transistor $Q_6$ is connected to the base of transistor $Q_7$ and further connected to a biasing terminal (Bias) 706. Transistor $Q_5$, $Q_6$ and $Q_7$ collectively form a current source 702 for biasing the cross-coupled transistors $Q_1$ and $Q_2$. The collector of transistor $Q_1$ is connected to inductor $L_1$, the anode of varactor diode $D_1$ while the collector of transistor Q2 is connected to inductor L2 and the anode of varactor diode $D_2$. The varactor diodes $D_1$ and $D_2$ have interconnected cathodes that are further connected to a control voltage $V_{ctrl}$ via a resistor $R_1$. Inductors $L_3$ and $L_4$ are mutually coupled (M) to inductors $L_1$ and $L_2$ respectively during operation to produce a pair of differential outputs via the emitters of transistors $Q_3$ and $Q_4$. The pair of differential outputs is fed to the external circuitry and the polyphase filter as described earlier. The emitters of transistors $Q_3$ and $Q_4$ are connected to ground via biasing resistors $R_2$ and $R_3$ respectively. The collectors of transistors $Q_3$ and $Q_4$ and the other terminals of inductors $L_1$ to $L_4$ are connected to a biasing voltage $V_{DD}$.

The frequency of the clock signal is dependable on the resistance of an external resistor (not shown) couplable to the VCO 412 for coarse tuning of the frequency of the clock signal. The external resistor sets a current through the biasing terminal 706 for which the frequency of the clock signal varies linearly inversely with the current. For example, a current of approximately 0.5 mA typically provides an oscillating frequency of 11.77 Ghz while a current of approximately 1.0 mA typically provides an oscillating frequency of 9.85 GHz.

Figure 8:
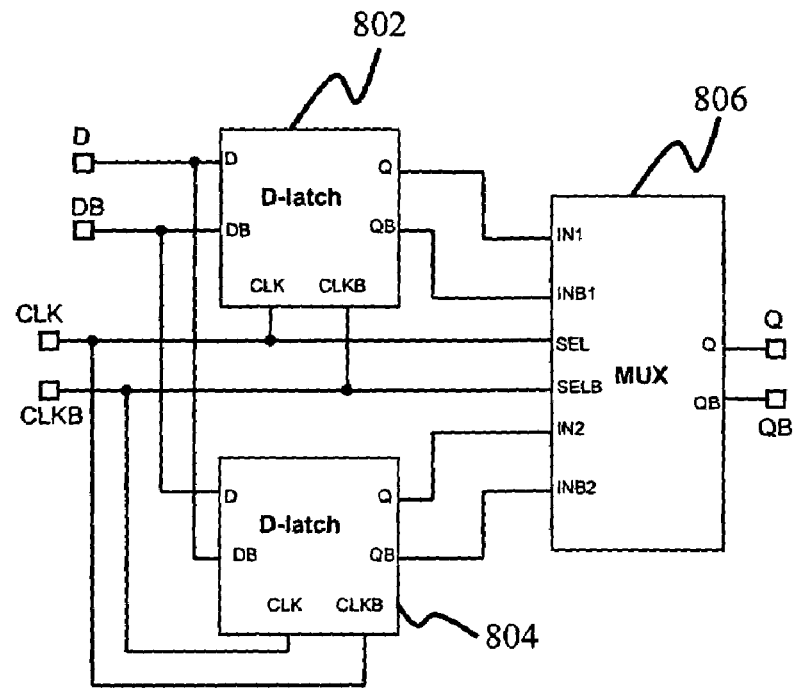
FIG. 8 is a block diagram of a frequency or phase detector of the clock and data recovery circuit of FIGS. 4 and 5.

FIG. 8 shows a block diagram of the phase and frequency detectors 402 and 404 of FIGS. 4 and 5. Each of the phase and frequency detectors 402 and 404 has two D-latches 802 and 804 coupled respectively to a multiplexer 806. The phase and frequency detectors 402 and 404 are structurally similar except for the multiplexer 806. A circuit diagram representing the respective D-latches 802 and 804 of the phase and frequency detectors 402 and 404 is shown in FIG. 9.

Figure 9:
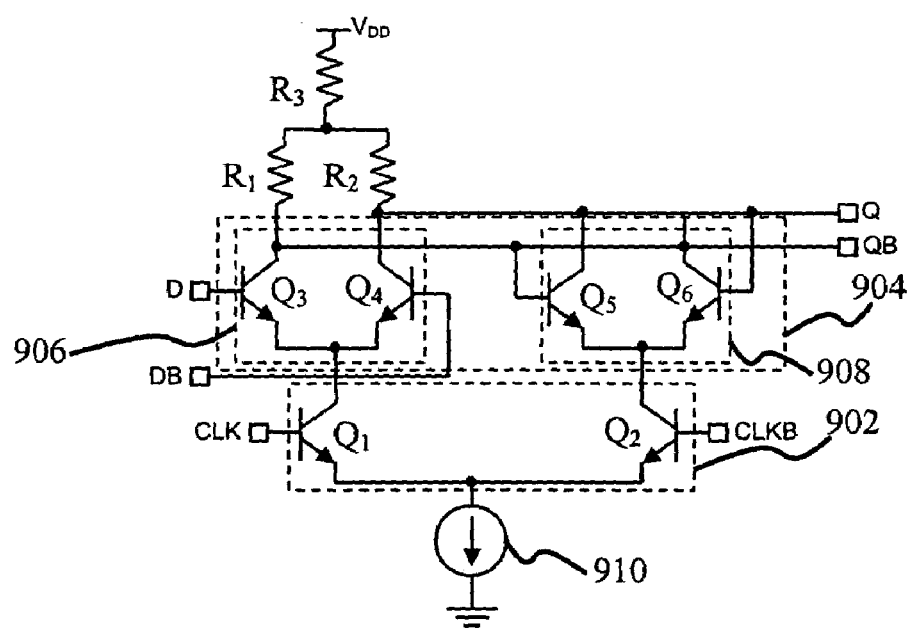
FIG. 9 is a circuit diagram of a D-latch of FIG. 8.

The D-latch of FIG. 9 comprises a differential input transistor pair 902 of transistors $Q_1$ and $Q_2$. The collectors of transistors $Q_1$ and $Q_2$ are coupled to a switching stage 906 that comprises two differential input transistor pairs 906 and 908 of transistors $Q_3$, $Q_4$ and transistors $Q_5$, $Q_6$ respectively. The emitters of transistors $Q_1$ and $Q_2$ are interconnected and further connected to ground via a current source 910. Each collector of transistors $Q_1$ and $Q_2$ is connected respectively to the emitters of the differential input transistor pairs 906 and 908 of the switching stage 904. The collector of transistor $Q_3$ is connected respectively to the base of transistor $Q_5$ and the collector of transistor $Q_6$ while the collector of transistor $Q_4$ is connected respectively to the collector of transistor $Q_5$ and the base of transistor $Q_6$. The D-latch of FIG. 9 is biased by a supply voltage $V_{DD}$ via biasing resistors $R_1$ to $R_3$. One terminal of biasing resistors $R_1$ is connected to the collector of transistor $Q_3$ while one terminal of biasing resistor $R_2$ is connected to the collector of transistor $Q_4$. The other terminals of biasing resistors $R_1$ and $R_2$ are interconnected and further connected to the supply voltage $V_{DD}$ via biasing resistor $R_3$. The NRZ data signal is received through the bases of transistors $Q_3$ and $Q_4$ of the switching stage 906 while output signal is provided via the base and collector of transistor $Q_6$. The recovered clock signal is input to the bases of transistors $Q_1$ and $Q_2$.

Figure 10:
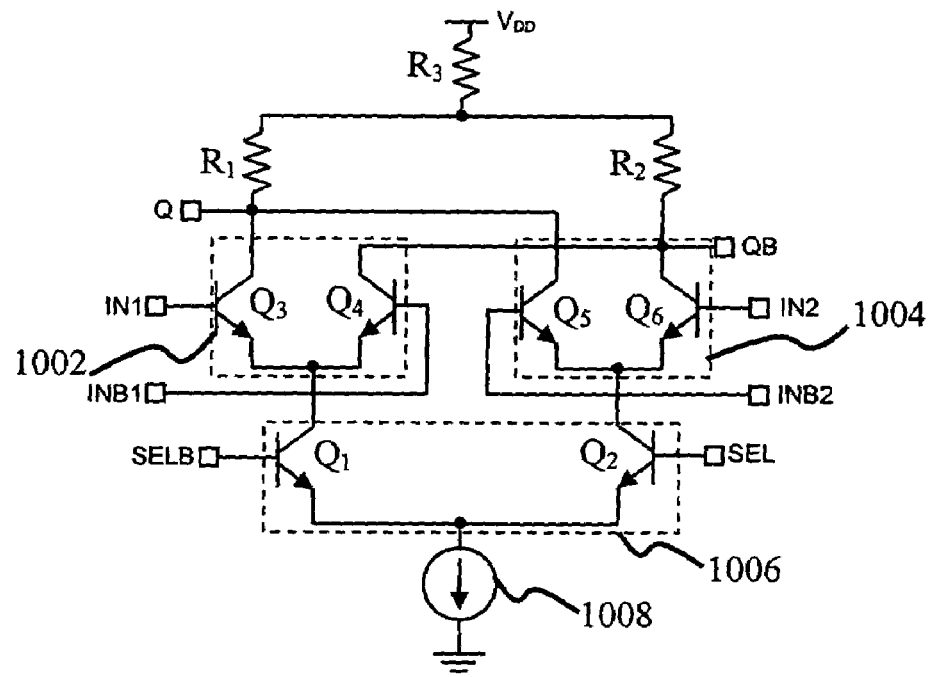
FIG. 10 is a circuit diagram of a multiplexer of the phase detector of FIG. 8.
Figure 11:
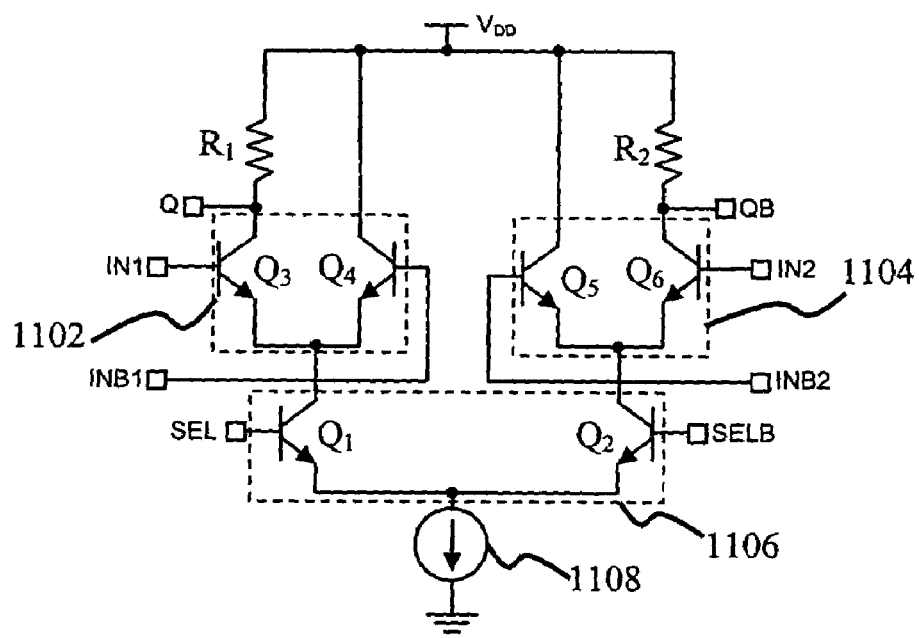
FIG. 11 is a circuit diagram of a multiplexer of the frequency detector of FIG. 8.

Each multiplexer of the phase and frequency detectors 402 and 404 is shown respectively in FIGS. 10 and 11. Both multiplexers of the phase and frequency detectors 402 and 404 have similar circuit configuration as the D-latch of FIG. 9.

A phase detector multiplexer 1000 is shown in FIG. 10 and comprises two differential input transistor pairs 1002 and 1004 of transistors $Q_3$, $Q_4$ and transistors $Q_5$, $Q_6$ respectively. The collectors of transistors $Q_3$ and $Q_5$ are interconnected and further connected to one terminal of biasing resistor $R_1$ while the collectors of transistors $Q_4$ and $Q_6$ are interconnected and further connected to one terminal of biasing resistor $R_2$. Output signal is provided via the collectors of transistor $Q_3$ and $Q_6$. The other terminals of biasing resistors $R_1$ and $R_2$ are interconnected for connection to the supply voltage VDD via biasing resistor $R_3$. The bases of transistors $Q_1$ and $Q_2$ of a differential input transistor pair 1006 are used for receiving the recovered clock signal while the bases of the differential input transistor pairs 1002 and 1004 are used for receiving output signals from the D-latches of FIG. 9. The collectors of transistors $Q_1$ and $Q_2$ are connected respectively to the emitters of the differential input transistor pairs 1002 and 1004. The emitter of transistors $Q_1$ and $Q_2$ are interconnected and further connected to ground via a current source 1008.

A frequency detector multiplexer 1100 is shown in FIG. 11 and has a similar circuit topology as the phase detector multiplexer 1000 of FIG. 10. The frequency detector multiplexer 1100 comprises two differential input transistor pairs 1102 and 1104 of transistors $Q_3$, $Q_4$ and transistors $Q_5$, $Q_6$ respectively. The collectors of transistors $Q_3$ and $Q_6$ are connected to the supply voltage VDD via biasing resistor $R_1$ and $R_2$ respectively and for providing output signal. The collectors of transistors $Q_4$ and $Q_5$ are connected directly to the supply voltage VDD. The bases of transistors $Q_1$ and $Q_2$ of a differential input pair 1106 are used for receiving the recovered clock signal while the bases of the differential input transistor pairs 1102 and 1104 are used for receiving output signals from the D-latches of FIG. 9. The collectors of transistors $Q_1$ and $Q_2$ are connected respectively to the emitters of the differential input transistor pairs 1102 and 1104. The emitter of transistors $Q_1$ and $Q_2$ are interconnected and further connected to ground via a current source 1108.

Although only one embodiment of the invention is disclosed, it becomes apparent to one skilled in the art in view of this disclosure that numerous changes and/or modification can be made without departing from the scope and spirit of the invention. For example, although NPN bipolar transistors are used in the forgoing embodiments of the invention, the transistors may perform similar operation if substituted by enhancement or depletion type MOS transistors or the likes.

The invention claimed is:

1. A clock and data recovery circuit for recovering a clock signal from a non-return to zero data signal and re-timing the data signal, the clock and data recovery circuit comprising:
   a phase detector for receiving the non-return to zero data signal and detecting phase difference between the non-return to zero data signal and a first reference phase signal for providing a phase detector output signal;
   a quadrature phase detector for receiving the non-return to zero data signal and detecting phase difference between the non-return to zero data signal and a second reference phase signal for providing a quadrature phase detector output signal;
   a frequency detector coupled to the phase detector and the quadrature phase detector for detecting frequency difference between the phase detector output signal and the quadrature phase detector output signal for providing a frequency detector output signal;
   a summer coupled to the phase detector and the frequency detector for summing the phase detector output signal and the frequency detector output signal for providing a summer output signal;
   a voltage-controlled oscillator for receiving a direct current signal and providing a recovered clock signal;

a polyphase filter coupled respectively to the voltage-controlled oscillator for receiving the clock signal therefrom, the phase detector for providing the first phase reference signal thereto, and the quadrature phase detector signal for providing the second reference phase signal thereto; and a re-timer for receiving the non-return to zero data signal and being coupled to the polyphase filter for receiving the first reference phase signal for providing a re-timed data signal, wherein the clock and data recovery circuit is on-chip and the polyphase filter converts the clock signal into the first reference phase signal and the second reference phase signal.

2. The clock and data recovery circuit of claim 1, wherein an external filter is coupled respectively to the summer for receiving the summer output and the voltage-controlled oscillator for providing the direct current signal.

3. The clock and data recovery circuit of claim 1, wherein each of the first reference phase and the second reference phase consist of a pair of signals having a phase difference of 180 degrees.

4. The clock and data recovery circuit of claim 1, wherein each signal of the first reference phase and the second reference phase has a different phase angle.

5. The clock and data recovery circuit of claim 1, wherein the voltage-controlled oscillator is coupled to the polyphase filter via a buffer.

6. The clock and data recovery circuit of claim 1, wherein the summer is coupled to the external filter via an amplifier.

7. The clock and data recovery circuit of claim 1, wherein a data buffer provides the non-return to zero data signal.

8. The clock and data recovery circuit of claim 1, wherein the summer is coupled to the phase detector output via a differential-to-single-ended converter.

9. The clock and data recovery circuit of claim 1, wherein the summer is coupled to the frequency detector output via a differential-to-single-ended converter.

10. The clock and data recovery circuit of claim 1, wherein the polyphase filter has at least one four-phase network section.

11. The clock and data recovery circuit of claim 1, wherein the polyphase filter is coupled to the phase detector via a buffer.

12. The clock and data recovery circuit of claim 1, wherein the polyphase filter is coupled to the quadrature phase detector via a buffer.

13. The clock and data recovery circuit of claim 1, wherein the summer is one of single-ended and differential.

14. The clock and data recovery circuit of claim 1, wherein the voltage-controlled oscillator is an inductor-capacitor oscillator.

15. The clock and data recovery circuit of claim 1, wherein the frequency of the clock signal is dependable on the resistance of an external resistor couple to the voltage-controlled oscillator.

16. The clock and data recovery circuit of claim 1, wherein the phase detector, the quadrature phase detector, the frequency detector, the voltage-controlled oscillator and the re-timer are differential.

17. The clock and data recovery circuit of claim 2, wherein the external filter is a low-pass filter.

18. A method for recovering a clock signal from a non-return to zero data signal and re-timing the data signal, the method comprising the steps of:

detecting phase difference between the non-return to zero data signal and a first reference phase signal by a phase detector for generating a phase detector output signal;

detecting phase difference between the non-return to zero data signal and a second phase reference signal by a quadrature phase detector for generating a quadrature phase detector output signal;

detecting frequency difference between the phase detector output signal and the quadrature phase detector output signal by a frequency detector for providing a frequency detector output signal;

summing the phase detector output signal and the frequency detector output signal by a summer for providing a summing output signal;

filtering the summer output by an external filter for generating a direct current signal;

converting the direct current signal by a voltage-controlled oscillator for providing a recovered clock signal;

converting the recovered clock signal into the first reference phase signal and the second reference phase signal by a polyphase filter;

applying the first reference phase to the phase detector and a re-timer and applying the second reference phase to the quadrature phase detector;

applying the non-return to zero data signal to the re-timer and re-timing the non-return to zero data signal for providing a re-timed data signal.

19. The method of claim 18, further comprising the step of differentiating the phase detector output signal and the frequency detector output signal prior to the step of summing the phase detector output signal and the frequency detector output signal by the summer for providing the summing output signal.

20. The method of claim 19, further comprising the step of controlling the frequency of the recovered clock signal provided by the voltage-controlled oscillator by an external resistor.

* * * * *